(12) United States Patent
Chinnakkonda Vidyapoornachary et al.

(10) Patent No.: US 9,436,563 B2
(45) Date of Patent: Sep. 6, 2016

(54) MEMORY SYSTEM FOR MIRRORING DATA

(71) Applicant: GLOBALFOUNDRIES INC., Grand Cayman (KY)

(72) Inventors: Diyanesh B. Chinnakkonda Vidyapoornachary, Bangalore (IN); Kyu-hyoun Kim, Mount Kisco, NY (US); Gary A. Tressler, Sandy Hook, CT (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 141 days.

(21) Appl. No.: 14/043,110

(22) Filed: Oct. 1, 2013

(65) Prior Publication Data

US 2015/0095552 A1   Apr. 2, 2015

(51) Int. Cl.
*G06F 11/20* (2006.01)
*G06F 11/16* (2006.01)
*G11C 14/00* (2006.01)

(52) U.S. Cl.
CPC ....... *G06F 11/2058* (2013.01); *G06F 11/1666* (2013.01); *G11C 14/009* (2013.01); *G06F 11/2015* (2013.01)

(58) Field of Classification Search
None
See application file for complete search history.

(56) References Cited

U.S. PATENT DOCUMENTS

| | | | |
|---|---|---|---|
| 7,924,635 B2 | 4/2011 | Kim | |
| 8,285,955 B2* | 10/2012 | Frame et al. | 711/162 |
| 8,296,496 B2 | 10/2012 | Mogul et al. | |
| 2009/0006790 A1* | 1/2009 | Bartley et al. | 711/157 |
| 2009/0119464 A1* | 5/2009 | Grundy et al. | 711/154 |
| 2009/0125671 A1* | 5/2009 | Flynn | G06F 9/52 711/103 |
| 2009/0216946 A1* | 8/2009 | Sun | G06F 3/0613 711/114 |
| 2009/0313416 A1 | 12/2009 | Nation | |
| 2011/0153916 A1 | 6/2011 | Chinnaswamy et al. | |
| 2012/0210089 A1* | 8/2012 | Larson | 711/167 |
| 2012/0239860 A1* | 9/2012 | Atkisson et al. | 711/103 |
| 2013/0003288 A1 | 1/2013 | Kanapathippillai et al. | |
| 2013/0198448 A1* | 8/2013 | Ish et al. | 711/113 |

FOREIGN PATENT DOCUMENTS

WO   2013016723 A2   1/2013

OTHER PUBLICATIONS

Anonymous, "Two-Tier Main Memory Subsystem and its Management", IP.com Prior Art Database, Dec. 11, 2012. IP.com Number: IPCOM000224156D.

(Continued)

*Primary Examiner* — Jared Rutz
*Assistant Examiner* — William E Baughman
(74) *Attorney, Agent, or Firm* — Thompson Hine LLP

(57) ABSTRACT

A memory system is disclosed, which may include a memory unit of a first type, susceptible to loss of data from corrupting events, and a memory unit of a second type, less susceptible to loss of data from corrupting events than the memory unit of the first type, and a mirrored memory interface (MMI). The MMI may be coupled to a memory controller, the memory unit of the first type, and the memory unit of the second type. The MMI may, in response to a memory controller write command, receive data from the memory controller and write the data to the memory unit of the first type and to the memory unit of the second type. The MMI may also, in response to a memory controller read command, read data from the memory unit of the first type and send the data to the memory controller.

15 Claims, 5 Drawing Sheets

(56) References Cited

OTHER PUBLICATIONS

IBM, "Hybrid Memory DIMM That Contains Mainstream DRAM With a Secondary DRAM Type to Allow Higher Capacity at Lower Power",IP.com Prior Art Database, Apr. 28, 2009. IP.com No. : IPCOM000182374D.
U.S. Patent and Trademark Office, Office Action issued in corresponding U.S. Appl. No. 14/057,427 issued Jan. 5, 2016.

* cited by examiner

MEMORY SYSTEM FOR MIRRORING DATA

TECHNICAL FIELD

The present disclosure relates to memory systems. In particular, this disclosure relates to mirroring data using a plurality of memory devices.

BACKGROUND

Semiconductor memory devices may be useful to store data and instructions for a processor in electronic computer systems and other electronic devices. A memory controller may be used as an interface device between the processor and the memory devices.

A number of different types of memory devices may be used in electronic systems, for example, dynamic random-access memory (DRAM), static random-access memory (SRAM) and non-volatile memory, such as flash devices. Memory device characteristics such as access speed, cost, power consumption, data capacity, density, and reliability may be considered by a designer in determining a memory type suitable for a particular application.

Industry-standard memory buses (channels) and interfaces may be used to electrically couple the elements of a memory system together, and to a memory controller and/or processor. Memory bus definitions may include a standardized set of electrical signals, associated signaling protocol and wiring.

SUMMARY

Various aspects of the present disclosure may be useful for providing a high reliability, high availability memory system to a computer or other electronic system. A memory system designed according to embodiments of the present disclosure may make efficient use of available memory controller channels and memory bus bandwidth, while providing frequently mirrored data to a processor.

Embodiments may be directed towards a memory system. The memory system may include a memory unit of a first type, that is susceptible to loss of data from corrupting events of a particular type, a memory unit of a second type that is less susceptible to loss of data from corrupting events of the particular type than the memory unit of the first type, and a mirrored memory interface (MMI). The MMI may be coupled to a memory controller through a first memory bus, and to the memory unit of the first type, through at least one memory channel, and to the memory unit of the second type through a second memory bus. The MMI may be configured to, in response to a write command from the memory controller, receive data from the memory controller and write the data to the memory unit of the first type and to the memory unit of the second type. The MMI may also be configured to, in response to a read command from the memory controller, read data from the memory unit of the first type and send the data to the memory controller.

Embodiments may also be directed towards a memory system including a plurality of memory units of a first type that are susceptible to loss of data from corrupting events of a particular type. The memory system may also include a memory unit of a second type that is less susceptible to loss of data from corrupting events of a particular type than the memory unit of the first type, having a storage capacity at least as large as an aggregate capacity of the plurality of memory units of the first type. The memory system may also include a plurality of MMIs arranged in a daisy-chain configuration, with a proximal end of the daisy-chain coupled to a memory controller, and a distal end of the daisy-chain coupled to the memory unit of the second type. Each MMI may be coupled to a corresponding memory unit of the plurality of memory units of the first type through at least one memory channel. The memory system may be configured to, in response to a write command from the memory controller, receive data from the memory controller and write the data to the memory unit of the first type selected by the write command, and write the data to the memory unit of the second type. The memory system may be also be configured to, in response to a read command from the memory controller, read data from the memory unit of the first type selected by the read command and send the data to the memory controller.

Embodiments may also be directed towards a method for operating a memory system. The method can include receiving a write command and data from a memory controller and selecting a memory unit of a first type, in response to the write command. The method may also include writing the data to the selected memory unit of the first type and writing the data to a memory unit of a second type, in response to receiving the write command. The method can also include receiving a read command from the memory controller and selecting a memory unit from one member of a group consisting of: a memory unit of the first type and the memory unit of the second type, in response to receiving the read command. The method may further include reading data from the selected memory unit, and sending the data to the memory controller, in response to receiving the read command. Aspects of the various embodiments may be used to mirror stored data in a plurality of memory units of different types, for example volatile and non-volatile memory. Aspects of the various embodiments may also be useful for mirroring data stored in a first type of memory unit in a memory unit of the second type.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of embodiments of the disclosure and are not limiting.

In the drawings and the Detailed Description, like numbers generally refer to like components, parts, steps, and processes

DETAILED DESCRIPTION

Figure 1:
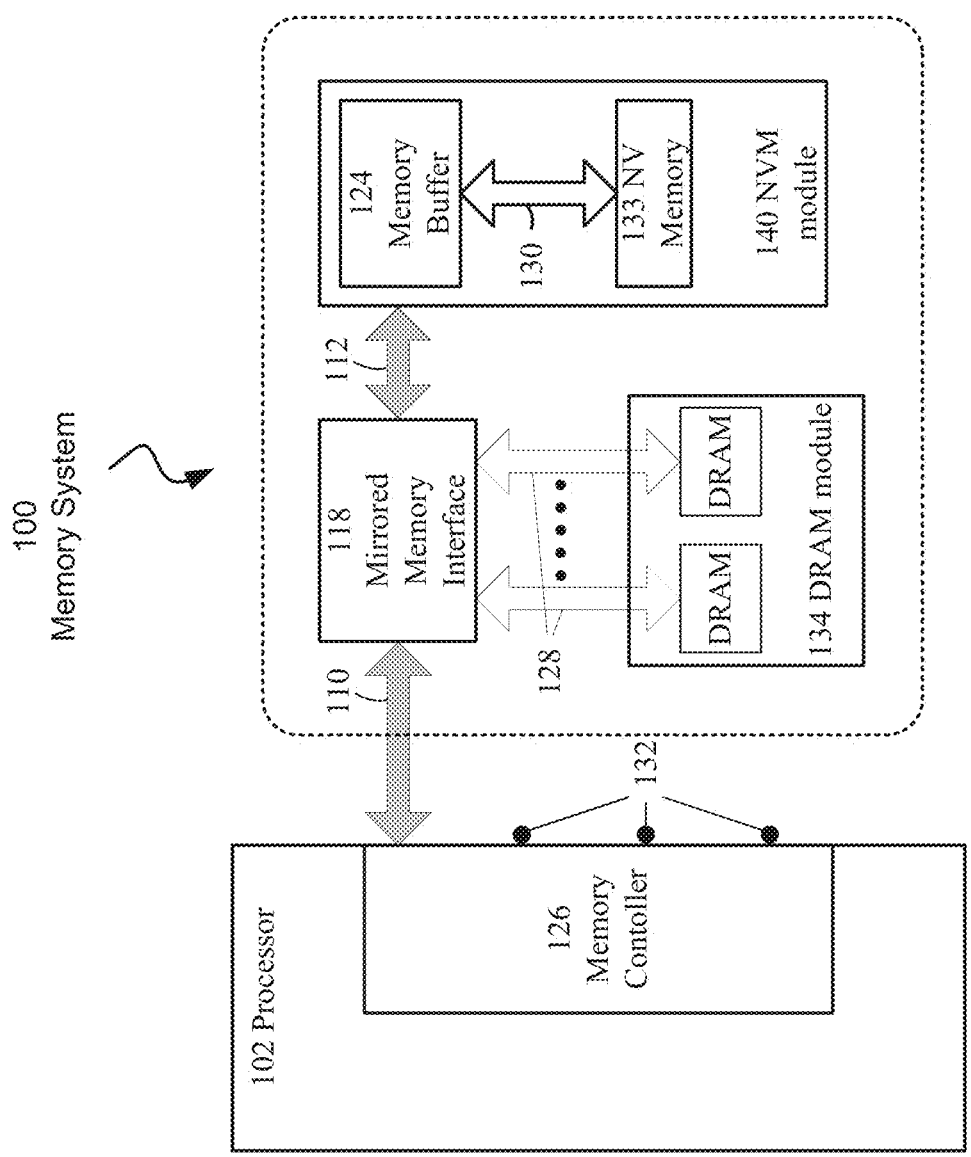
FIG. 1 is a block diagram representation of a memory system including a mirrored memory interface and two types of memory units, according to embodiments of the present disclosure.

Certain embodiments of the present disclosure can be appreciated in the context of a memory system for inclusion in, or use with a computer system having a processor and a memory controller. Such computer systems may include but are not limited to desktop personal computers, laptop computers, and servers. While not necessarily limited thereto, embodiments discussed in this context can facilitate an understanding of various aspects of the disclosure. Certain embodiments may also be directed towards other equipment and associated applications, such as a memory system for use with or inclusion in a computer system having a cluster of interconnected processors, or processor cores. Such computer systems may include but are not limited to mainframe computers and supercomputers. Embodiments may also be directed towards a memory system for use with or inclusion in an electronic device or system such as a personal digital assistant (PDA), cell phone, tablet or gaming system.

In general, various embodiments of the present disclosure relate to memory systems configured to mirror data stored in one or more memory units of a first type, into a memory unit of second type, and thereby provide high-reliability, high-availability data storage.

Efficient use of memory bus bandwidth and memory controller resources may result from the use of a single memory bus (channel) for coupling the memory system to the memory controller. The memory system may receive a single write command, and associated address and data, which may result in the data being written by the memory system into two separate memory units. This sequence of operations may be used in place of the memory controller initiating two separate write operations to two separate memory units, and may be a useful and cost-effective way to reduce the consumption of memory controller bandwidth, power, and I/O pins.

A memory system designed according to certain embodiments may be compatible with existing and proven memory controllers and data buses. A memory system constructed according to embodiments of the present disclosure may protect a computer system from the effects of data loss or corruption resulting from a variety of causes, such as variation in, or loss of memory system power supply voltage.

Processors in computer and other electronic systems may require the storage of, and access to, large amounts of information, including both executable software, and data files, in order to carry out processing tasks. Semiconductor-based memory may be useful for, and may be included in, the design of a data storage system for use with processor's. Certain characteristics of volatile/dynamic memory devices (e.g., dynamic random-access memories or DRAMs) may generally match the performance needs of data storage systems. For example, DRAMs may be generally cost-effective, have high data storage capacities and densities, and have fast access times, relative to other semiconductor memory types. The general match of DRAM device characteristics to the needs of data storage systems may cause them to be chosen by a system designer for use in such systems.

Dynamic memory devices, e.g., DRAMs, may experience either the loss of, or corruption of, stored data, which may result from a plurality of corrupting events. For example, failure of, or variations of a memory system power supply may cause storage data to become corrupted or erased. High-reliability and high-availability performance goals that may be set for particular types of memory systems may not necessarily be achievable through the exclusive use of volatile memory types (such as DRAM) as data storage devices in the memory system.

A mirrored memory system, in which multiple redundant copies of data are routinely stored, may be useful in mitigating the consequences of lost or corrupted data. Data mirroring may include making copies of data frequently enough to ensure consistency between the copies. For example, in one application, data may be copied corresponding to every write operation.

In such systems, if one copy of the data is determined to be corrupt, for example, through error checking codes (ECC), then a secondary copy of the data may be retrieved and used in its place.

The present disclosure relates generally to memory units including two types of memory technology, having different reliability characteristics, and in particular, different levels of susceptibility to data loss resulting from power supply variations or failure. For instance, the first type of memory technology may have a susceptibility to data loss in response to a type of corruption event (e.g., power loss), while the second type of memory technology may have less susceptibility to the same type of corruption event (e.g., power loss). The technology types may include many forms of semiconductor memory, for example volatile, non-volatile random-access memory (NVRAM) or flash, DRAM, SRAM, or other technologies. For the purpose of discussion, the two different technology types are discussed herein in terms of volatile memory and nonvolatile memory, with DRAM being used as an example of volatile memory, and NVRAM (flash) memory used as an example of nonvolatile memory; however, the various embodiments discussed herein are not necessarily so limited. Another example of a non-volatile memory device may include a low-power memory unit powered by a power supply with a battery backup. Technology types may also include memory devices making use of resistive, magnetic, or material properties to enable storage of data.

A mirroring memory system may be designed to compensate for weaknesses which may be inherent to volatile memory devices. Mirrored (redundant) data storage systems may be useful for high-availability, high reliability applications, for example, financial, medical or security applications, where the loss or corruption of data may have catastrophic results.

A mirrored memory system may be configured to provide redundant storage capability by coupling multiple memory controller channels to separate memory units. Such a configuration may consume a significant portion of the overall memory channel bandwidth (resulting in reduced memory system capacity), memory controller I/O signal and power pins, and a significant amount of power.

For the purpose of this discussion, the term "bandwidth" may be used to denote a maximum possible amount of data that a particular memory channel, bus, or system may be capable of transmitting over a given period of time (which may be measured in bits/second). The term "throughput" may be used to denote an actual (successful) data transfer rate over a given period of time (which may be measured in bits/second) through a particular memory channel, bus, or system.

The throughput of a particular memory channel, bus, or system may be lower than its bandwidth. For example, a DMI 2.0 physical link between a memory controller and a memory device may have a (maximum realizable) bandwidth of 20 gigabits per second (Gbit/s). However if the memory device is intrinsically limited to receiving and sending data at 10 Gbit/s, the resulting (maximum) throughput of the DMI 2.0 link may thus be 10 Gbit/s. Actual throughput of a particular memory channel, bus, or system may be constrained by factors including, but not limited to, transmission overhead (due to parity or error correction bits included with data), or retransmissions required due to a noisy media channel.

The terms "channel" and "bus" may be used interchangeably to refer to a defined (generally through and industry-standard specification) interconnection scheme between any of the elements of a memory system, memory devices and memory controllers.

While all figures illustrate the principles and features of the present disclosure, they are not limiting in any way. Embodiments may include a different number of or different types of memory units and memory buses, within the scope and spirit of the disclosure. It may be appreciated that new and presently undeveloped integrated circuit memory technology options may become available, and may be useful in the practice of the present disclosure.

Embodiments of the present disclosure may be directed towards a memory system configured to maintain a mirrored (duplicate) copy of data written to it. FIG. 1 is a block diagram depiction of a memory system 100, including a mirrored memory interface 118, a memory unit of a first type 134, and a memory unit of a second type 140, according to embodiments of the present disclosure. Memory system 100 may be generally used as a data storage device for use with processor 102, and may be coupled to, accessed, and controlled by memory controller 126. Memory system 100 may be particularly useful in providing processor 102 with data that may be continuously mirrored in a plurality of types of memory units, which may allow recovery of data corrupted in, or lost from, one of the memory units. Memory system 100 may therefore be employed as a high-reliability, high-availability data storage device.

Memory system 100, in response to a write command from memory controller 126, may receive, in the mirrored memory interface 118, data from the memory controller 126 to be written into at least one memory unit. The mirrored memory interface 118 may then write the data in a parallel operation into the memory unit of the first type (DRAM module) 134, and into the memory unit of the second type (Non-Volatile Memory Module) 140, which may ensure storage of consistent copies of the data.

The mirrored memory interface 118 may be coupled to memory controller 126 through first memory bus 110, to memory unit 140 through second memory bus 112, and to memory unit 134 through memory channels 128.

Mirrored memory interface 118 may be designed to have a limited delay between the parallel write operations to the memory unit 134 and the memory unit 140, to ensure that the data written into one unit is consistent with data written into the other unit. For example, the delay may be constrained to be less than one memory write cycle. The design of memory system 100 may limit data and command latency between system elements, for example between the mirrored memory interface 118 and the memory buffer 124. Memory system 100, and in particular mirrored memory interface 118, may be designed to operate at throughput rates consistent with the throughput of memory controller 126. Consistency of data between the memory unit 134 and the memory unit 140 may allow recovery of data written into the memory unit 134 from the memory unit 140.

A read command (from the memory controller 126) and its accompanying read address may contain information used by the mirrored memory interface 118 to select a memory unit (134, 140) to read data from. Memory system 100, in response to the read command from memory controller 126, may read data during a read operation from the memory unit 134 and send the data to the memory controller 126, according to read address information accompanying a read command. Memory system 100, in response to the read command from memory controller 126, may also read data during a recovery read operation from the memory unit 140 and send the data to the memory controller 126, according to read address information accompanying a read command. The capability of the mirrored memory interface 118 to read data from memory units 134 and 140 may be useful for recovering data (performing a recovery read operation) from one of the memory units (134, 140), should the data become lost from or corrupted in the other memory unit, and may also be useful in checking consistency of data between the two memory units.

The memory unit of the first type 134 may include, but is not limited to volatile memory. Volatile memory generally refers to a type of memory device which may employ a periodic refresh of the data contained within it, and may generally suffer a loss of data following the cessation of periodic refresh operations, or loss of power supply voltage. Volatile memory may include, for example, dynamic random-access memory (DRAM) devices, which may be configured as dual in-line memory modules (DIMMs), consistent with memory which may be used in a personal computer system.

The memory unit 140 may include, but is not limited to non-volatile memory, such as memory device 133. Non-volatile memory generally refers to a type of memory device which may not require periodic refresh of the data contained within it, and generally does not suffer a loss of data following the removal of a device power supply voltage. Non-volatile memory 133 may include, for example, flash or electrically erasable programmable read-only memory (EEPROM) memory devices, consistent with memory which may be used in a solid-state drive (SSD), or USB memory stick. Non-volatile memory 133 may also include a low-power memory unit powered by a power supply with a battery backup, or non-volatile memory technologies which may presently exist, or which may be developed in the future.

The memory unit 140 may also include a memory buffer 124, coupled to the second memory bus 112 and to a memory device of the second type (Non-Volatile Memory) 133. The memory buffer 124 may be used to temporarily store data being written to or read from non-volatile memory device 133, which may have a lower throughput than the second memory bus 112.

The memory buffer 124 temporarily storing data may allow memory bus 112 to operate at a higher effective throughput rate than memory device 133, and thus may allow memory system 100 operate at the full bandwidth of memory buses 112, 110. Memory bus 130 may be used to couple memory buffer 124 to memory device 133.

In order for the memory unit 140 to mirror the data contained in memory unit 134, the memory capacity of memory unit 140 may be greater than or equal to the memory capacity of the memory unit 134.

Memory buses 110, 112 and 130 may be used to transfer memory data, addresses and read/write commands between various elements (118, 134 and 140) of memory system 100 and to and from memory controller 126. First memory bus 110, second memory bus 112, and memory bus 130 may be consistent with industry memory bus standards and protocols, for example, the Direct Media Interface (DMI), the Unified Media Interface (UMI), or the Peripheral Component Interconnect (PCI) bus. Memory controller 126 may be designed to function as an interface between processor 102 and a memory device or system, via an industry memory bus, as listed above.

Memory channels 128 may comprise groupings of signals which may be used to control and access volatile memory devices such as DRAM DIMMs. Memory channels 128 may include CLK, DQ, DQS and CMD signals, for example. The number and types of memory channels 128 coupling mirrored memory interface 118 to memory unit 134 may be specified by a designer for a specific application, and may be determined based upon the amount and type of memory included in memory unit 134.

The processor 102 may comprise a microprocessor, or cluster of interconnected processing units and/or cores. The memory controller 126 may act as an interface between the processor 102 and the memory system 100, sending and receiving commands address and data. Reference 132 depicts memory channels of the memory controller 126 that are not used to interface to memory system 100, and are available for connection to other memory devices or systems.

FIG. 1 depicts the mirrored memory interface 118, coupled to and configured to write to memory units 134 and 140 in a parallel write operation, and to read data independently from both memory units. Mirrored memory interface 118 is also coupled to memory controller 126 through a single memory bus 110. According to embodiments of the present disclosure, the memory system 100 may provide high reliability data storage for a computer or other electronic system through maintaining multiple copies of data within storage units of different types. Memory system 100 can also use only one memory channel to interface with a memory controller 126, a configuration which may be useful in making additional channels 132 available to other devices and applications.

Embodiments of the present disclosure may be implemented on a printed circuit (PC) board, an electronic module, on an IC, or a combination of these elements, consistent with available IC and electronic packaging technologies.

Figure 2:
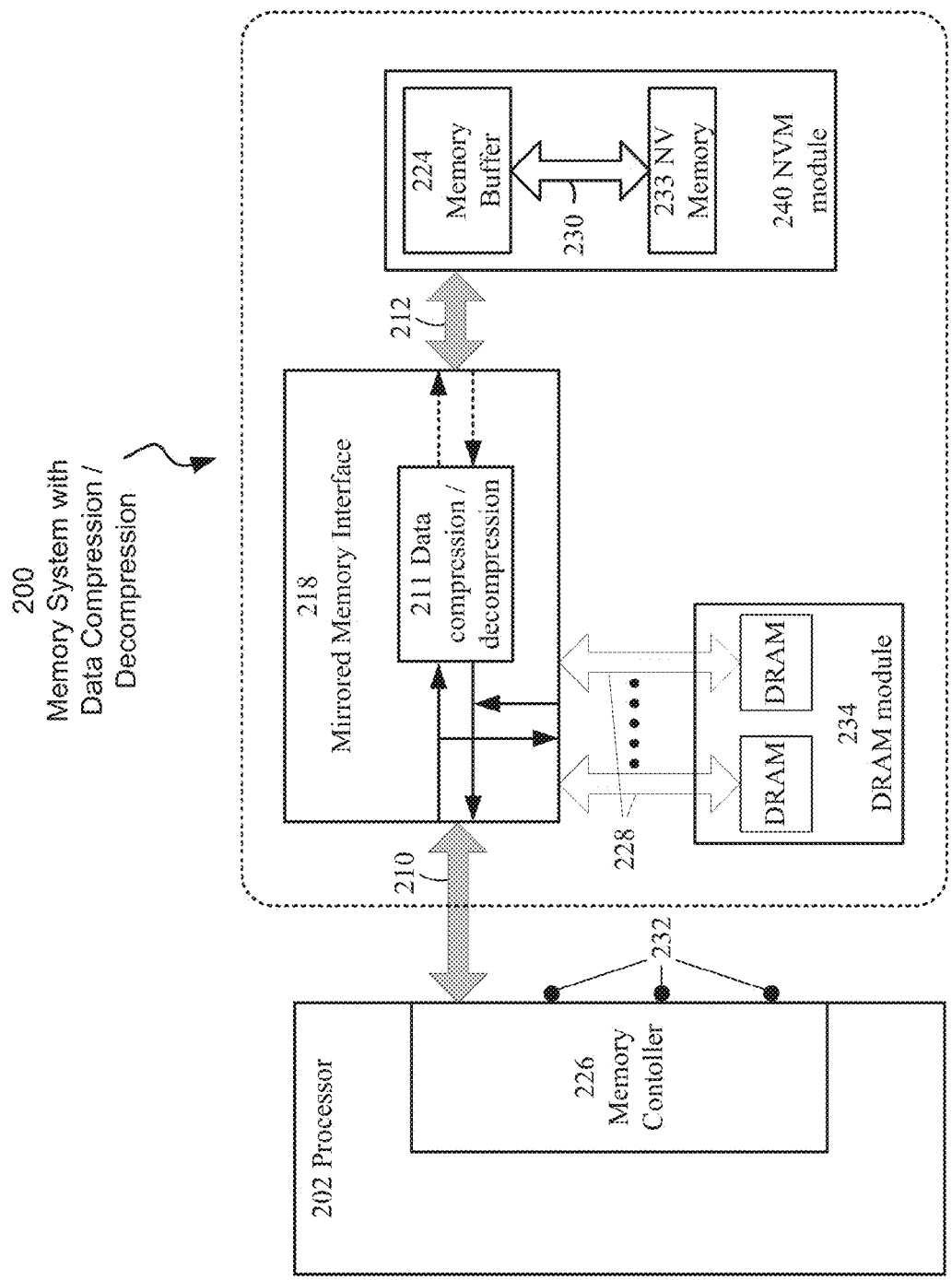
FIG. 2 is a block diagram representation of a memory system including a data compression/decompression unit, according to embodiments.

FIG. 2 is a block diagram depiction of a memory system with data compression/decompression 200, including a mirrored memory interface 218, a memory unit of a first type 234, and a memory unit of a second type 240, according to embodiments consistent with FIG. 1. Mirrored memory interface 218 may also include data compression/decompression unit 211. Memory system 200 may be generally used as a data storage device for use with processor 202, and may be coupled to, accessed, and controlled by memory controller 226. Memory system 200 may be particularly useful in providing processor 202 with data that may be continuously mirrored in a plurality of different types of memory units, which may allow recovery of data corrupted in or lost from one of the memory units. Memory system 200 may therefore be employed as a high-reliability data storage device.

Memory units 234 and 240 are consistent in structure, interconnection and function with memory units 134 and 140 respectively, as described and illustrated in FIG. 1. The memory unit 240 may also include a memory buffer 224, coupled to the second memory bus 212 and to a memory device of the second type (Non-Volatile Memory) 233. Similarly, aspects of processor 202, memory controller 226, memory buses 210, 212, 230 and memory channels 228 are consistent in type, structure, interconnection and function with similarly numbered counterparts described and illustrated in FIG. 1. Mirrored memory interface 218 may be consistent with mirrored memory interface 118 (FIG. 1) in the aspects of interconnection and interaction with its associated memory unit 234, and memory controller 226.

Mirrored memory interface 218 includes a data compression/decompression unit 211, which may be used to compress data received from memory controller 226 before it is written into memory unit 240, and decompress data read from memory unit 240, before it is sent to the memory controller 226. The compression and decompression function provided by 211 may allow for a reduction of size of memory unit 240 (relative to the size of memory unit 240 used for uncompressed data), while still allowing data contained in memory unit 234 to be mirrored a memory unit 240. Data compression/decompression unit 211 may also be useful in reducing the power consumption of memory buses 212, 230 and memory unit 240, in response to a smaller amount of (compressed) data that may be transferred across memory bus 212.

A variety of data compression/decompression algorithms may be implemented in data compression/decompression unit 211, according to the type of data to be stored in memory units 234 and 240. A particular compression/decompression algorithm may be specifically suited for alphanumeric, audio, video, still image or other types of data.

FIG. 2 depicts the mirrored memory interface 218, coupled to and configured to write uncompressed data to memory unit 234, and compressed data to memory unit 240, in a parallel write operation, and to read data (and uncompress data from memory unit 240) independently from both memory units. Mirrored memory interface 218 is also coupled to memory controller 226 through a single memory bus 210.

According to embodiments of the present disclosure, the memory system 200 may provide high reliability storage of compressed and uncompressed data for a computer or other electronic system through maintaining multiple copies of data within storage units of different types. Memory system 200 can also use only one memory channel to interface with a memory controller 226, a configuration which may be useful in making additional memory controller channels 232 available to other devices and applications. The data compression/decompression unit 211 in mirrored memory interface 218 may be useful in reducing memory bandwidth requirements and power consumption of memory bus 212.

Embodiments of the present disclosure may be implemented on a printed circuit (PC) board, an electronic module, on an IC, or a combination of these elements, consistent with available IC and electronic packaging technologies.

Figure 3:
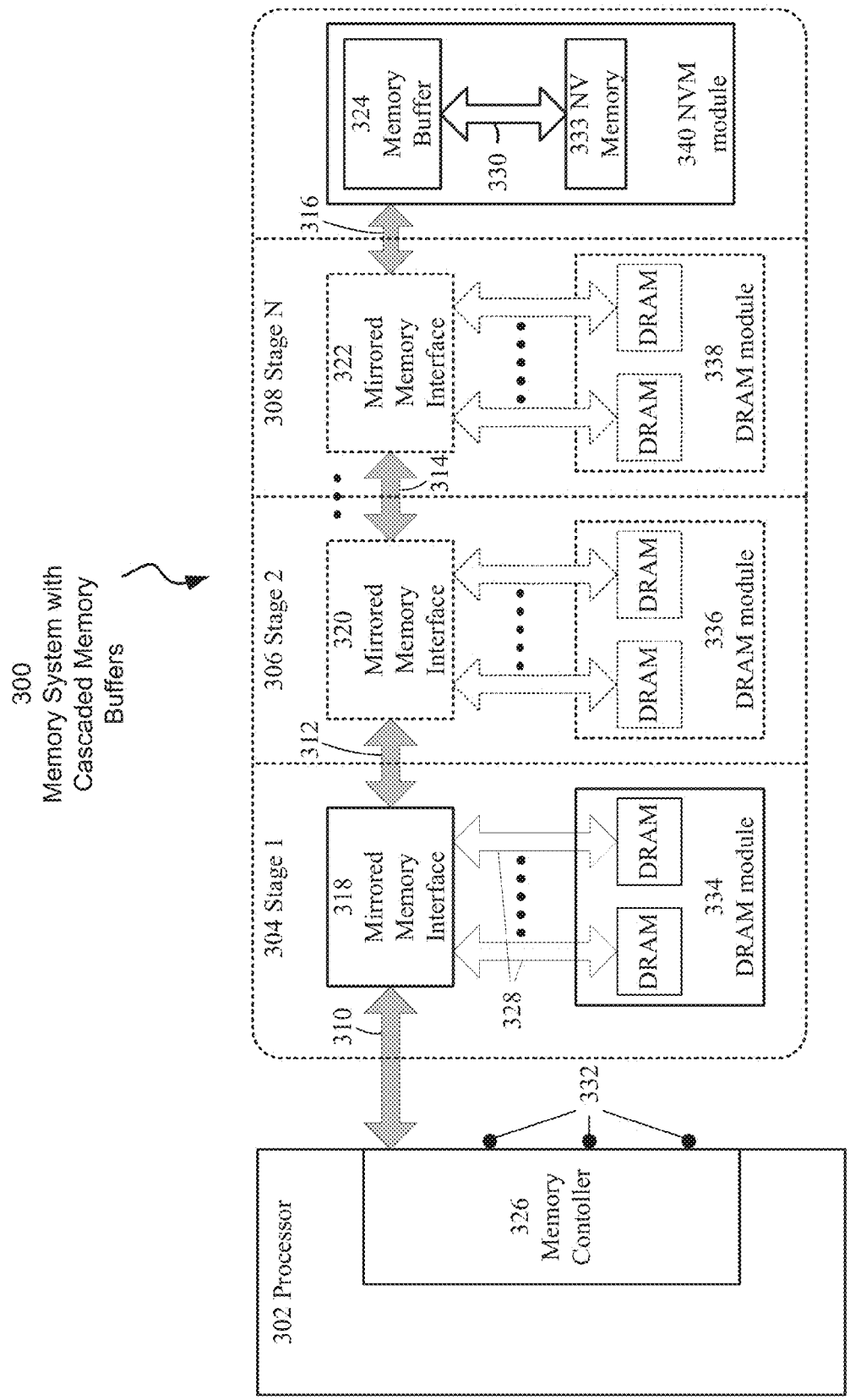
FIG. 3 is a block diagram representation of a memory system including a plurality of memory units of one type, according to embodiments.

FIG. 3 is a block diagram depiction of a memory system with cascaded mirrored memory interfaces 300, including a plurality of mirrored memory interface stages 304, 306, 308, arranged in a daisy-chain configuration. Memory system 300 may be generally used as a data storage device for use with a processor 302, and may be coupled to, accessed, and controlled by a memory controller 326. Memory system 300 may be particularly useful in providing processor 302 with data that may be continuously mirrored in a plurality of different types of memory units, which may allow recovery of data corrupted in or lost from one of the memory units. Memory system 300 may therefore be employed as a multi-stage, high-reliability data storage device. The mirrored memory interface stages are coupled to a memory unit of a second type 340, according to embodiments generally consistent with FIG. 1. Each mirrored memory interface stage 304, 306, 308 includes a mirrored memory interface (318, 320, 322, respectively) and a memory unit of a first type (334, 336, 338, respectively).

A write command (received from the memory controller 326) and its accompanying write address may contain information used by the mirrored memory interfaces 318, 320 and 322 to select a memory unit (334, 336, 338, respectively) to write data to. Memory system 300, in response to the write command received from memory controller 326, may receive data from the memory controller 326 and write the data into one of the memory units 334, 336, 338, and into the memory unit 340.

The data may first be written into mirrored memory interface 318, which may then write the data into memory unit 334, in response to information (in the write command and its accompanying write address) indicating memory unit 334 as a destination for the data. The mirrored memory interface 318 may, in a parallel operation, transmit the data to the adjacent mirrored memory interface 320. Mirrored memory interface 320, similarly to mirrored memory interface 318, may then write the data to memory unit 336 (based on information contained in a write command and its accompanying write address), and transmit the data in a parallel operation to mirrored memory interface 322. Each mirrored memory interface in the daisy-chain structure of the memory controller 300 may repeat the above operations, until the mirrored memory interface 322 at the distal end of the daisy-chain transmits the data to memory unit 340. Memory unit 340 may then receive and write the data to memory device of the second type 333, as described in reference to FIG. 1. The writing of data into a memory unit of the first type (334, 336, and 338) and into the memory unit of the second type 340 may ensure storage of a plurality of consistent copies of the data.

A read command (received from the memory controller 326) and its accompanying read address may contain information used by the mirrored memory interfaces 318, 320 and 322 to select a memory unit (334, 336, 338) to read data from. Reading data from memory system 300 may involve series of operations similar to the write operations, where each mirrored memory interface in the daisy-chain may either read the data from its attached memory unit (in response to information contained in the read command and the accompanying read address), or may transmit the read command and address to the next mirrored memory interface, progressing towards the distal end of the daisy-chain. The mirrored memory interface corresponding to the target read address may read the data and return it to the memory controller 326 through the other mirrored memory interfaces and coupled memory buses.

Memory system 300, in response to the read command received from memory controller 326, may read data during a read operation from one of the memory units 334, 336, 338 (according to read address information accompanying a read command), and send the data to the memory controller 326. Memory system 300 may also read data during a recovery read operation from the memory unit 340 and send the data to the memory controller 326, according to read address information accompanying a read command.

The capability of the memory system 300 to read data from a plurality of memory units may be useful for recovering data that may become lost from or corrupted in one of the memory units (334, 336, 338), and may also be useful in checking consistency of data between multiple memory units.

Memory units of the first type 334, 336 and 338 may include, but are not limited to volatile memory, and are consistent in structure, interconnection (to mirrored memory interfaces 318, 320, 322, respectively) and function with memory unit 134, as described and illustrated in FIG. 1. The memory unit of the second type 340 may include, but is not limited to non-volatile memory, such as memory device 333, and is consistent in structure, interconnection and function with memory unit 140, as described and illustrated in FIG. 1. Similarly, aspects of processor 302, memory controller 326, memory buses (310, 312, 314, and 316) and memory channels 328 are consistent in structure, interconnection and function with similarly numbered counterparts described and illustrated in FIG. 1.

The memory unit 340 may also include a memory buffer 324, coupled to the memory bus 316 at the distal end of the daisy-chain, and to a memory device of the second type 333, by memory bus 330, consistent with the description associated with FIG. 1. In order for the memory unit 340 to mirror the data contained in memory units 334, 336 and 338, the memory capacity of memory unit 340 may be greater than or equal to the memory capacity of the memory units 334, 336 and 338, sufficient to store the data contained in these memory units.

Mirrored memory interface stages (e.g., 304, 306, and 308) may be coupled together by memory buses (e.g., 312, 314 and 316). A proximal end of the daisy-chain may be coupled to memory controller 326, by memory bus 310, and a distal end of the daisy-chain may be coupled to the memory unit 340 by memory bus 316. Mirrored memory interface 318 may interact with memory controller 326 in a manner consistent with the interaction of mirrored memory interface 118 and memory controller 126.

Memory buses 310, 312, 314, 316 and 330 may be used to transfer memory data, addresses and read/write commands between various elements (318, 320, 322, 324 and 340) of memory system 300, and to/from memory controller 326, and may be consistent with industry memory bus standards and protocols, for example, the Direct Media Interface (DMI), the Unified Media Interface (UMI), or the Peripheral Component Interconnect (PCI) bus.

Memory controller 300 is depicted having three mirrored memory interface stages; however embodiments may include a different number of mirrored memory interface stages. The number of stages in a memory controller 300, according to embodiments, may be limited by memory bus bandwidth, memory controller latency and other system design considerations. For example, each additional mirrored memory interface stage added to the daisy-chain configuration may add additional bus latency to the memory controller, which may prohibit the memory controller from performing data writes to both types of memory units in a consistent manner.

Memory system 300 may also be designed to limit data and command latency between system elements, for example between the mirrored memory interface 318 and the mirrored memory interface 320. Memory system 300, and in particular mirrored memory interfaces 318, 320, 322, may be designed to operate at throughput rates consistent with the throughput of memory controller 326, in order to not limit the throughput of memory controller 326, and the performance of processor 102.

Memory system 300 may be designed to have a limited delay between the parallel write operations to one of the memory units of the first type (334, 336, 338) and the memory unit of the second type 340, to ensure that the data written into the memory unit of the second type is consistent with data written into the memory unit of the first type. For example, the delay may be constrained to be less than one memory write cycle. Consistency of data between the memory units of the first type (334, 336, and 338) and the memory unit of the second type 340 may allow recovery of data written into memory unit (334, 336, and 338) from the memory unit 340.

FIG. 3 depicts a daisy-chain of mirrored memory interfaces coupled to and configured to write to one of the memory units 334, 336, 338 and to memory unit 340 in a parallel write operation, and to read data independently from the memory units. Mirrored memory interface 318 is also coupled to memory controller 326 through a single memory bus 310.

According to embodiments of the present disclosure, the memory system 300 may provide high reliability data storage for a computer or other electronic system through maintaining multiple copies of data within a plurality of memory units of different types. Memory system 300 may also use only one memory channel to interface with a memory controller 326, a configuration which may be useful in making additional channels 332 available to other devices and applications.

Embodiments of the present disclosure may be implemented on a printed circuit (PC) board, an electronic module, on an IC, or a combination of these elements, consistent with available IC and electronic packaging technologies.

Figure 4:
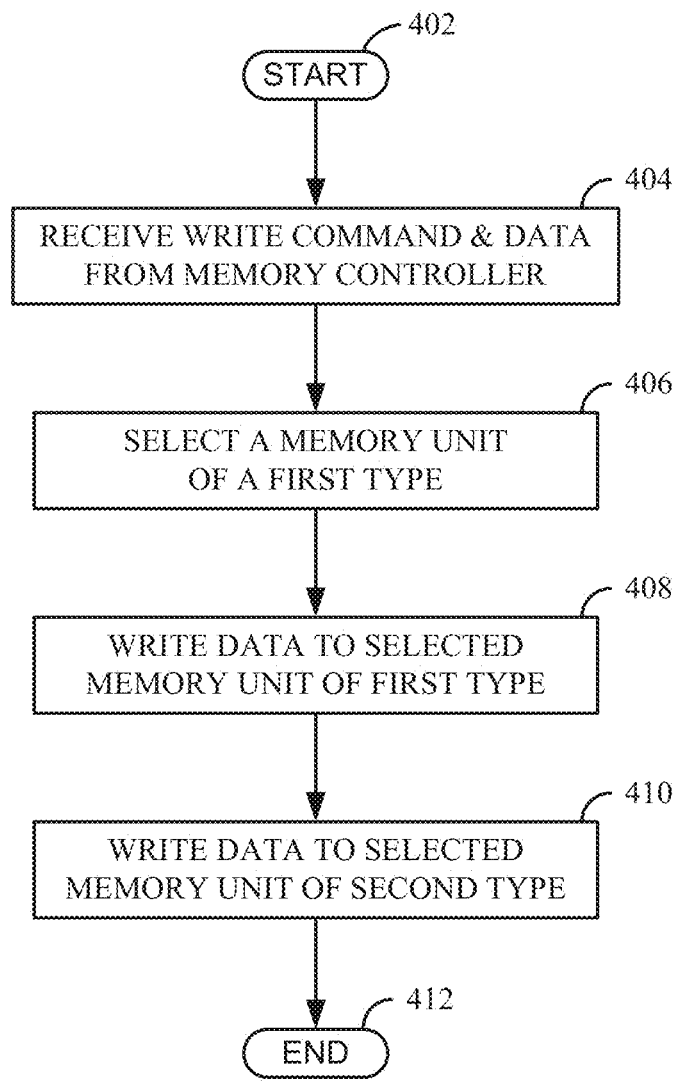
FIG. 4 is a flow diagram illustrating steps for a mirrored data write operation, according to embodiments.

FIG. 4 is a flow diagram illustrating steps for a mirrored data write operation, according to embodiments. The process 400 moves from start 402 to operation 404. Operation 404 generally refers to at least one mirrored memory interface receiving a write command and corresponding data from a memory controller. In embodiments, the mirrored memory interface and memory controller may correspond to 118 (FIG. 1) and 126 (FIG. 1) respectively, and their associated descriptions. The write command may contain write address information, which may be useful to at least one mirrored memory interface in determining a write destination of the corresponding received data. Once a write command and corresponding data have been received by least one mirrored memory interface, the process moves to operation 406.

Operation 406 generally refers to the selection of a memory unit of the first type by a mirrored memory interface, in response to write address information contained within the write command received by the mirrored memory interface. The memory unit of the first type may correspond to 134 (FIG. 1), and its associated description, in embodiments. The selection operation may be useful in specifying one memory unit of a plurality of memory units of the first type, and may enable the use of a large addressable memory space. Once a memory unit of the first type is selected, the process moves to operation 408.

Operation 408 generally refers to the writing of received data into a selected memory unit of the first type by the mirrored memory interface, in response to the write command and data received by the mirrored memory interface. Some embodiments (e.g., FIG. 1, 2) may include a single memory unit of the first type, while some embodiments (e.g., FIG. 3) may include a plurality of memory units of the first type. The selected memory unit of the first type may include volatile memory such as dynamic random-access memory (DRAM), which may be arranged on dual in-line memory modules (DIMMs). The mirrored memory interface may be useful in maintaining high memory system throughput by receiving commands and data from the memory controller and also managing a signal interface with the memory unit of the first type. Once the received data is written into a selected memory unit of the first type, the process moves to operation 410.

Operation 410 generally refers to the writing of data into the selected memory unit of the second type by the mirrored memory interface, in response to the write command and data received by the mirrored memory interface. The memory unit of the second type may be non-volatile and consistent with Non-Volatile Memory (NVM) module 140 (FIG. 1), and its associated description, in embodiments. The process of writing data into the memory module of the second type may be done in parallel with operation 408, and may enable mirroring of the received data in both the memory unit of the first type and the memory unit of the second type. The presence of mirrored data may allow recovery of data from the memory unit of a second type, should the data in the memory unit of first type become corrupted or lost. Once the data is written into a selected memory unit of the second type, the process 400 may end at block 412.

Figure 5:
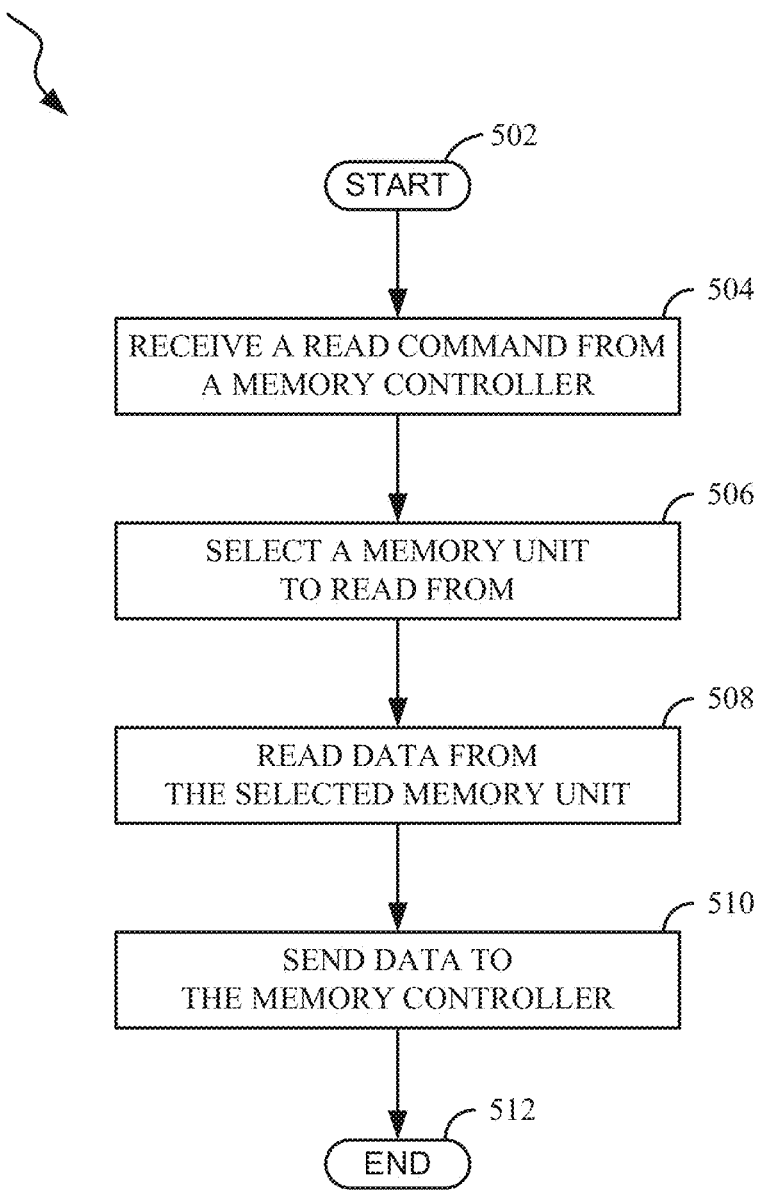
FIG. 5 is a flow diagram illustrating steps for a recovery read operation, according to embodiments.

FIG. 5 is a flow diagram illustrating steps for a recovery read operation, according to embodiments. The process 500 moves from start 502 to operation 504. Operation 504 generally refers to at least one mirrored memory interface receiving a read command and corresponding read address from a memory controller. In embodiments, for example, the mirrored memory interface and memory controller may correspond to 118 (FIG. 1) and 126 (FIG. 1), respectively, and their associated descriptions. The read address accompanying a read command may be useful to at least one mirrored memory interface in determining a location of (and particular memory unit containing) the requested data. Once a read command and read address have been received by least one mirrored memory interface, the process moves to operation 506.

Operation 506 generally refers to a mirrored memory interface selecting a memory unit to read from, either one of the first type or the memory unit of the second type, in response to receiving the read command and read address information. In embodiments, the memory units of the first and second types may correspond to 134, 140 (FIG. 1), respectively, and their associated descriptions. The selection operation may be useful in specifying one memory unit of a plurality of memory units, and may enable the use of an expanded addressable memory space. The selection operation may also be useful by allowing a memory unit of the second type to be accessed during a recovery read operation. Once a memory unit is selected, the process moves to operation 508.

Operation 508 generally refers to the reading of requested data from selected memory unit by the mirrored memory interface, in response to the read command and accompanying read address information received by the mirrored memory interface. Some embodiments (e.g., FIG. 1, 2) may include a single memory unit of the first type, while some embodiments (e.g., FIG. 3) may include a plurality of memory units of the first type. Embodiments may include a memory unit of the second type. The selected memory unit of the first type may include volatile memory, for example, dynamic random-access memory (DRAM), which may be arranged on dual in-line memory modules (DIMMs). The memory unit of the second type may be non-volatile and consistent with NVM module 140 (FIG. 1), and its associated description, in embodiments. The mirrored memory interface may be useful in maintaining high memory system throughput by receiving commands from the memory controller and also managing interfaces with the memory units of the first and second types. Once the requested data is read from a selected memory unit, the process moves to operation 510.

Operation 510 generally refers to the sending of data read (from the selected memory unit of the first and second types) by the mirrored memory interface to the memory controller, in response to the read command and read address information received by the mirrored memory interface. The process of reading data from the memory module of the second type may be useful to recover data that may have become corrupted in or lost from the memory module of the first type. Once the data is sent to the memory controller, the process 500 may end at block 512.

Although the present disclosure has been described in terms of specific embodiments, it is anticipated that alterations and modifications thereof may become apparent to those skilled in the art. Therefore, it is intended that the following claims be interpreted as covering all such alterations and modifications as fall within the true spirit and scope of the disclosure.

What is claimed is:

1. A memory system comprising:
a first memory unit of a first type that is a volatile memory susceptible to a loss of data in response to a loss of a power supply voltage supplying power to the memory system;
a second memory unit of a second type that is a non-volatile memory less susceptible to the loss of data in response to the loss of the power supply voltage than the first memory unit; and
a mirrored memory interface coupled to:
a memory controller, through a first memory bus;
the first memory unit, through a second memory bus; and
the second memory unit through a third memory bus;
the mirrored memory interface configured to:
in response to receiving a write command from the memory controller, receive data from the memory controller and write the data into the first memory unit and into the second memory unit, wherein the received data is continuously mirrored in the first and second memory units so that the first memory unit contains a duplicate copy of all the data in the second memory unit, and the second memory unit contains the duplicate copy of all the data in the first memory unit; and
in response to receiving a read command from the memory controller, read data from one of the first memory unit or the second memory unit and send the data read from the first or second memory unit to the memory controller; wherein the second memory bus has a first throughput rate, the third memory bus has a second throughput rate lower than the first throughput rate, writing the data into the first memory unit comprises writing uncompressed data into the first memory unit at the first throughput rate, and
writing the data into the second memory unit comprises compressing the data to reduce a memory bandwidth requirement of the third memory bus so that the data is written into the second memory unit at an effective throughput rate equal to the first throughput rate.

2. The memory system of claim 1, wherein the second memory unit includes:
a memory device of the second type, and
a memory buffer that couples the third memory bus to the memory device.

3. The memory system of claim 1, wherein the mirrored memory interface is further configured to, in response to the read command from the memory controller and in a recovery read operation, read data from the second memory unit and send the data read from the second memory unit to the memory controller.

4. The memory system of claim 1, wherein a storage capacity of the second memory unit is sufficient to mirror the data contained in the first memory unit.

5. The memory system of claim 1, wherein writing the data into the first memory unit and into the second memory unit is a parallel operation that allows recovery of the data written into the first memory unit from the second memory unit.

6. The memory system of claim 1, wherein the mirrored memory interface includes a data compression/decompression unit configured to compress the data received from the memory controller and to decompress the data read from at least one of the first memory unit and the second memory unit.

7. The memory system of claim 1 wherein the first memory unit includes a dynamic random-access memory (DRAM) device that is susceptible to the loss of data from a power supply variation.

8. The memory system of claim 7, wherein the DRAM device is a dual in-line memory module (DIMM).

9. The memory system of claim 1, wherein the second memory unit includes a flash memory device.

10. The memory system of claim 1, wherein the first memory bus is a direct media interface (DMI) channel.

11. The memory system of claim 1, wherein the third memory bus is a direct media interface (DMI) channel.

12. A memory system comprising:
a plurality of first memory units of a first type that are volatile memory units susceptible to a loss of data from a loss of a power supply voltage supplying power to the memory system;
a second memory unit of a second type that is a non-volatile memory unit less susceptible to the loss of data from the loss of the power supply voltage than the first memory units, the second memory unit having a storage capacity at least as large as an aggregate capacity of the first memory units;
a plurality of mirrored memory interfaces arranged in a daisy-chain having a proximal end coupled to a memory controller and a distal end coupled to the second memory unit, each mirrored memory interface being coupled to a corresponding first memory unit of the plurality of first memory units through at least one memory channel;
wherein the memory system is configured to:
in response to a write command from the memory controller, receive data from the memory controller and write the data into a first memory unit selected by the write command, and write the data into the second memory unit, wherein the received data is continuously mirrored in the first memory units and the second memory unit so that the first memory units contain a duplicate copy of all the data in the second memory unit, and the second memory unit contains the duplicate copy of all the data in the first memory units; and
in response to a read command from the memory controller, read data from one of the first memory units selected by the read command or the second memory unit and send the data read from the first or second memory unit to the memory controller; wherein the first memory units are coupled to the memory controller through a first memory bus having a first throughput rate, the second memory unit is coupled to the memory controller through a second memory bus having a second throughput rate lower than the first throughput rate, writing the data into the first memory units comprises writing uncompressed data into the first memory units at the first throughput rate, and writing the data into the second memory unit comprises compressing the data to reduce a memory bandwidth requirement of the second memory bus so that the data is written into the second memory unit at an effective throughput rate equal to the first throughput rate.

13. The memory system of claim 12, wherein the memory system is further configured to, in response to the read command from the memory controller and in a recovery read operation, read the data from the second memory unit, and send the data read from the second memory unit to the memory controller.

14. The memory system of claim 12, wherein the second memory unit includes:

a memory device of the second type; and a memory buffer that couples the distal end of the daisy-chain to the memory device.

15. The memory system of claim 12, wherein the memory system is configured to perform a parallel write of the data into the first memory unit selected by the write command and into the second memory unit that allows recovery of the data written into the first memory unit from the second memory unit.

* * * * *